(12) United States Patent
Jain

(10) Patent No.: US 7,474,113 B2
(45) Date of Patent: Jan. 6, 2009

(54) FLEXIBLE HEAD PROBE FOR SORT INTERFACE UNITS

(75) Inventor: Sunil K Jain, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/280,741

(22) Filed: Oct. 25, 2002

(65) Prior Publication Data
US 2004/0080329 A1    Apr. 29, 2004

(51) Int. Cl.
*G01R 31/02* (2006.01)
(52) U.S. Cl. .................. 324/765; 324/754; 324/761
(58) Field of Classification Search ............... 324/73.1, 324/754–762, 765, 158.1; 439/482; 29/830, 29/852
See application file for complete search history.

(56) References Cited

U.S. PATENT DOCUMENTS

| | | | | |
|---|---|---|---|---|
| 5,576,630 A * | 11/1996 | Fujita | ................. | 324/760 |
| 5,670,889 A * | 9/1997 | Okubo et al. | ........... | 324/760 |
| 6,047,469 A * | 4/2000 | Luna | ................. | 29/830 |
| 6,064,215 A * | 5/2000 | Kister | ................. | 324/754 |
| 6,215,321 B1 * | 4/2001 | Nakata | ............... | 324/754 |
| 2004/0032271 A1 * | 2/2004 | Blackwood et al. | ....... | 324/754 |

* cited by examiner

*Primary Examiner*—Minh N Tang
(74) *Attorney, Agent, or Firm*—Sharon Wong

(57) ABSTRACT

Embodiments of the invention provide a flexible probe head that improves contact force and uniform mechanical contact pressure between the probe feature and an engaged bond pad. Flexible probe head is formed from a plurality of conductive wires embedded in a high frequency elastomer material. During wafer sort, the flexible probe head is in contact communication with die under test. The flexible probe head assumes the natural co-planarity of the surface of the die under test and sort interface unit.

10 Claims, 11 Drawing Sheets

FLEXIBLE HEAD PROBE FOR SORT INTERFACE UNITS

BACKGROUND

Semiconductor devices are typically tested at the wafer level to evaluate their functionality. The process in which devices in a wafer are tested is commonly referred to as "wafer sort." Wafer testing and sorting typically involves the use of probing technology wherein a probe engages the bond pads on a die under test so as to connect the pads to a testing apparatus. FIGS. 1A and 1B illustrate a conventional testing configuration 100 for wafer (i.e. die) under test 102 including probe head 104, multi layer ceramic (MLC) space transformer 106, printed circuit board sort interface unit 108 with MLC footprint (not shown) and testing apparatus 110. Referring to FIG. 1A, probe head 104 may be a conventional buckling beam floating or non-floating probe head. Referring to FIG. 1B, conventional probe head 104 may be a cantilever beam or membrane type, generally considered more suitable for wire bond type packaging. Probe head 104 (i.e. beam) deflects upon contact with a solder bump on semiconductor die under test 102 by buckling or bending. Since the plurality of pin probes is relatively dense, and is typically connected to a larger pattern compatible with testing apparatus 110, an interconnection device such as a space transformer 106 is generally employed. Space transformer 106 interconnects probe head 104 to printed circuit board sort interface unit 108. Space transformer 106 is interconnected to multi layer printed circuit board 108. Probe head 104 sits below and in contact with the semiconductor die under test 102.

Conventional probe head technology is generally based upon floating or non-floating vertical buckling or cantilever beams employing precision spring action metal pins organized in a precision socket to exactly match the footprint of the die under test. Increasingly, tighter mechanical tolerances, higher pin counts, denser pitches, and ever aggravating need of higher electrical performances at high frequencies and so forth are making conventional probe heads more and more expensive and difficult to fabricate. Membrane type probe heads offer a better alternative than conventional mechanical cantilever beams for horizontal probing applications, but membrane probe heads are typically not suitable for technologies such as micro ball grid array, C4, chip scale or wafer level type packagings that are growing in usage and require vertical probing. Membrane probe head usage is typically limited to conventional wire bond type packaging that is diminishing. Other limitations of membrane probe heads are its inductance/impedance discontinuity and the need for custom fabrication, thus requiring time, money and resources.

With faster edge rates, signal integrity is becoming an important issue in device testing, and conventional methods do not appear promising enough to shrink the inductances and impedance discontinuities. Conventional probe technologies such as buckling beam, cantilever beam, membrane, and so forth tend to attribute to bottlenecks in high speed testing. Conventional probe heads also require an expensive space transformer to maintain local co-planarity. Problems associated with the space transformer include, but are not limited to, costs, lead times, routing densities, scalability, power decoupling and so forth. If the wafer sort is targeted to test multiple dies at a time, the complexity of the problems explodes exponentially, quickly limiting the scope of multiplicity of testing.

DETAILED DESCRIPTION

Figure 1A:
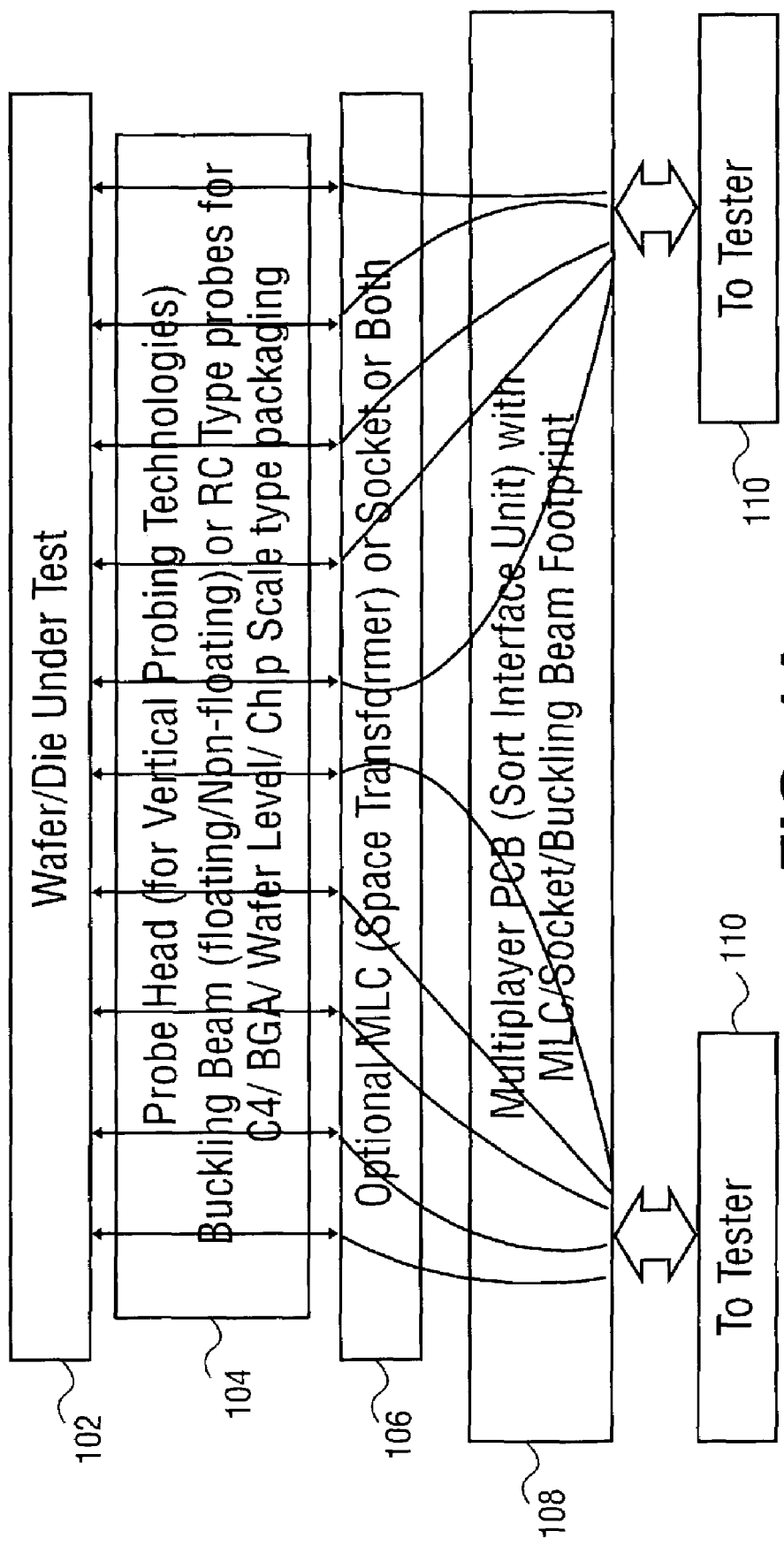
FIG. 1A illustrates a block diagrams of an embodiment of prior art wafer probing technology for vertical probing applications.

Embodiments of the invention provide a flexible probe head that improves contact force and uniform mechanical contact pressure between the probe feature and an engaged bond pad. Flexible probe head is formed from a plurality of conductive wires embedded in a high frequency elastomer material. During wafer sort, the flexible probe head is in contact communication with semiconductor die under test. The flexible probe head assumes the natural co-planarity of the surface of the die under test and sort interface unit.

The design steps of machining and precision matching the mechanical tolerances of the die under test and interface unit are minimized, resulting in significant savings in terms of lead-time as well as costs. Flexible probe head can be mounted to printed circuit board as either an add-on fixture to maintain flexibility of repairs or as direct soldered for better alignment and ruggedness. Dealing with multiple die sorting at a time, flexible probe head has its obvious advantages. Alternatively, it can also be used simply to replace the conventional probe head mounted on an existing multiple layer ceramic or space transformer. The manufacturing process becomes extremely simplified, low cost, and more reliable due to significantly reduced variable dependencies.

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The present invention can be directed to a single or multiple semiconductor die. In particular, one skilled in the art will recognize that the present invention may be applied at the wafer-scale, multiple die, or single die level. As used herein, the term "die" may denote a single die (chip) from a wafer or a plurality of dies, up to an entire wafer if wafer-scale integration is employed for the unit under test. Moreover, as used herein, the term "wafer scale" is not limited to traditional wafers but encompasses any semiconductive material layer on which a large plurality of discrete active devices may be fabricated, including but not limited to silicon-on-insulator (SOI) and silicon-on-sapphire (SOS) structures. Additionally, although references are made to the term "interface unit" it should be understood that the interface unit can be any suitable substrate upon which terminals can be formed and electronic components connected to. Although references are made to the term "bumps," it should be understood that the term may encompass balls, cylinders, cuboids, pyramids or cones (including truncated such structures). Furthermore, the term "bond pad" is intended to include and encompass all suitable terminal structures to which a diffusion bond may be made, including both elevated and recessed bond pads as well as flat, concave or convex bond pads and other terminal structures; and bond pads may be formed of gold-compatible materials. Additionally, the term "footprint" is intended to include and encompass contact pattern(s) or pin-out(s) of the die under test.

For illustrative purposes, embodiments of the present invention are described using controlled collapse chips connection (C4) packaging technology. It is to be appreciated that the invention need not be limited to C4 packaging. Instead, the process described above can be used and is contemplated for use in any process where conductive bumps are used in assembly technology. The other types of processes include but are not limited to wire bonding (WB) and tape automated bonding (TAB). During wafer sorting the probing features of the probe card contact the solder bumps.

Figure 1B:
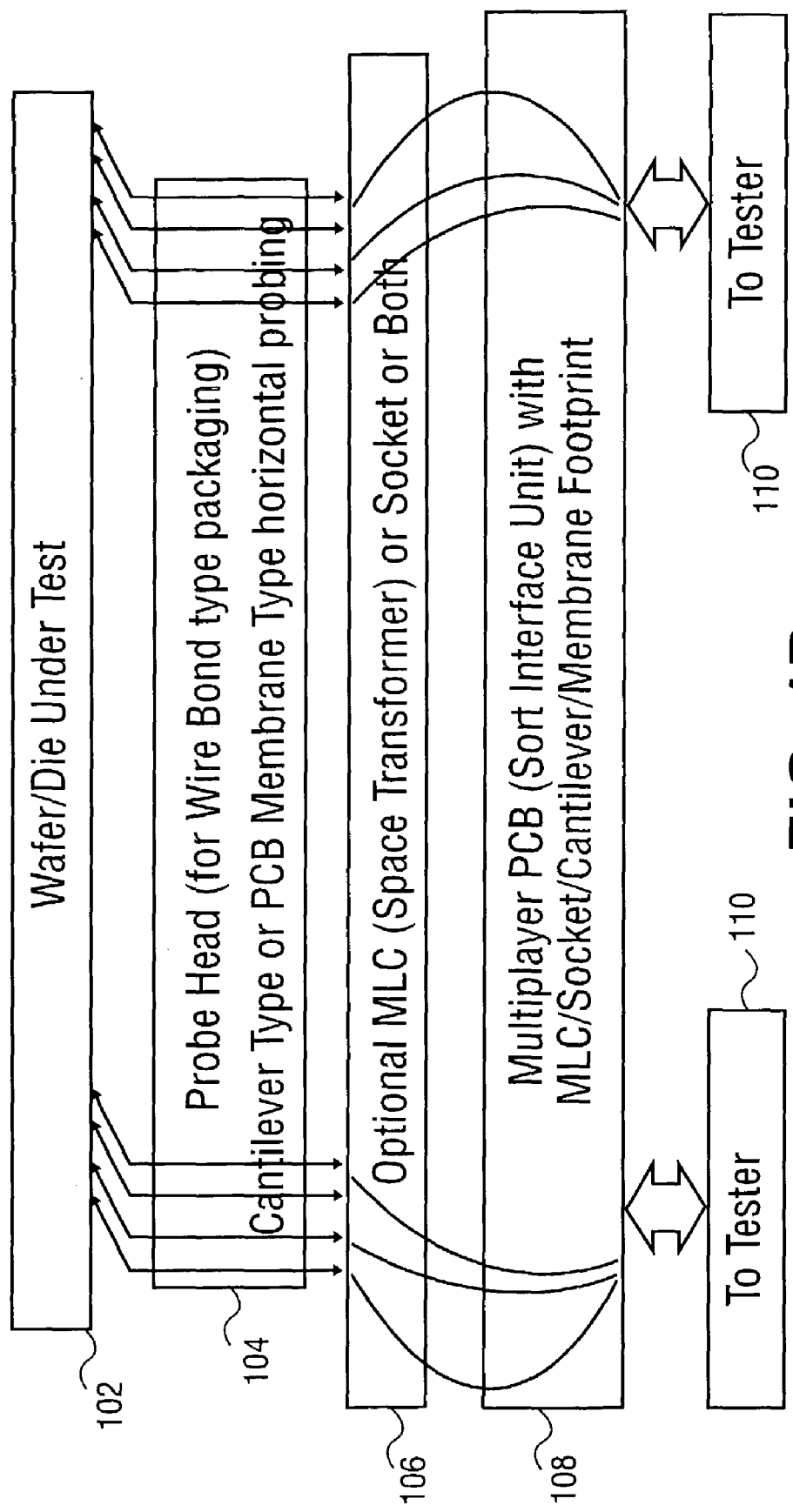
FIG. 1B illustrates a block diagrams of an embodiment of prior art wafer probing technology for horizontal probing applications.
Figure 2:
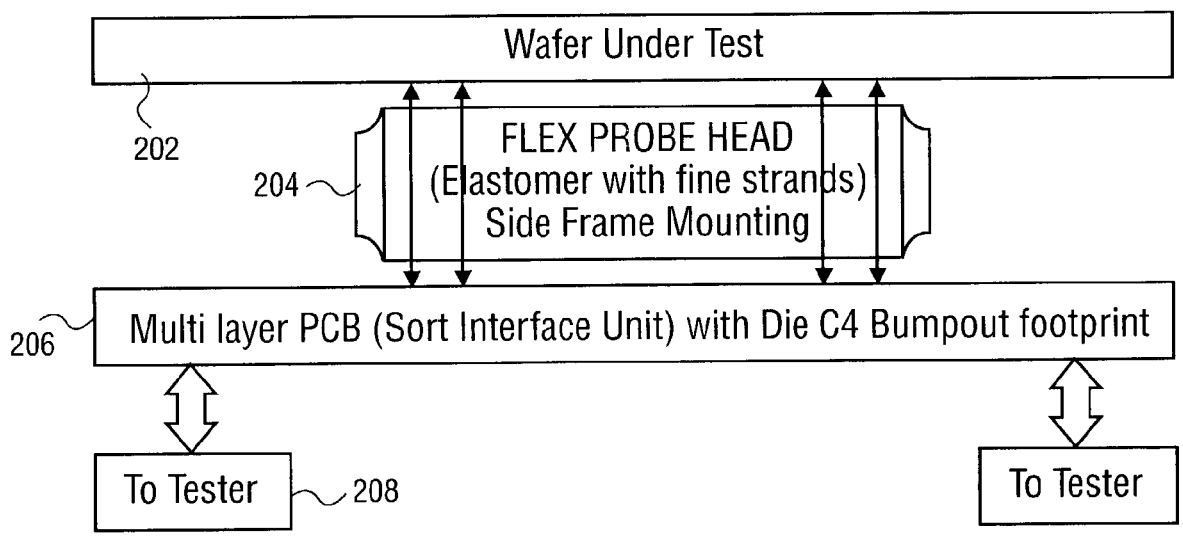
FIG. 2 illustrates a block diagram of an embodiment of wafer probing technology in accordance with the present invention.

FIG. 2 illustrates a block diagram of an embodiment 200 of a test configuration for semiconductor die under test 202 including flexible probe head 204, interface unit 206 and test device 208. In particular, flexible probe head 204 is disposed directly between semiconductor die under test 202 and interface unit 206. Semiconductor die under test 202 is positioned adjacent flexible probe head 204. Interface unit 206 provides a base for attachment of flexible probe head 204 and fan out wiring from the high density array of probe contacts to a larger grid of pins or other interconnection means to test device 208 used to electrically test semiconductor die under test 202. One skilled in the art will recognize that interface unit 206 maybe a conventional test interface such as a space transformer as shown in FIG. 1 or sort interface unit as shown in FIG. 2. In a typical embodiment, die and interface unit planes are substantially parallel and die and substrate electrical contacts are substantially coincident.

Figure 3:
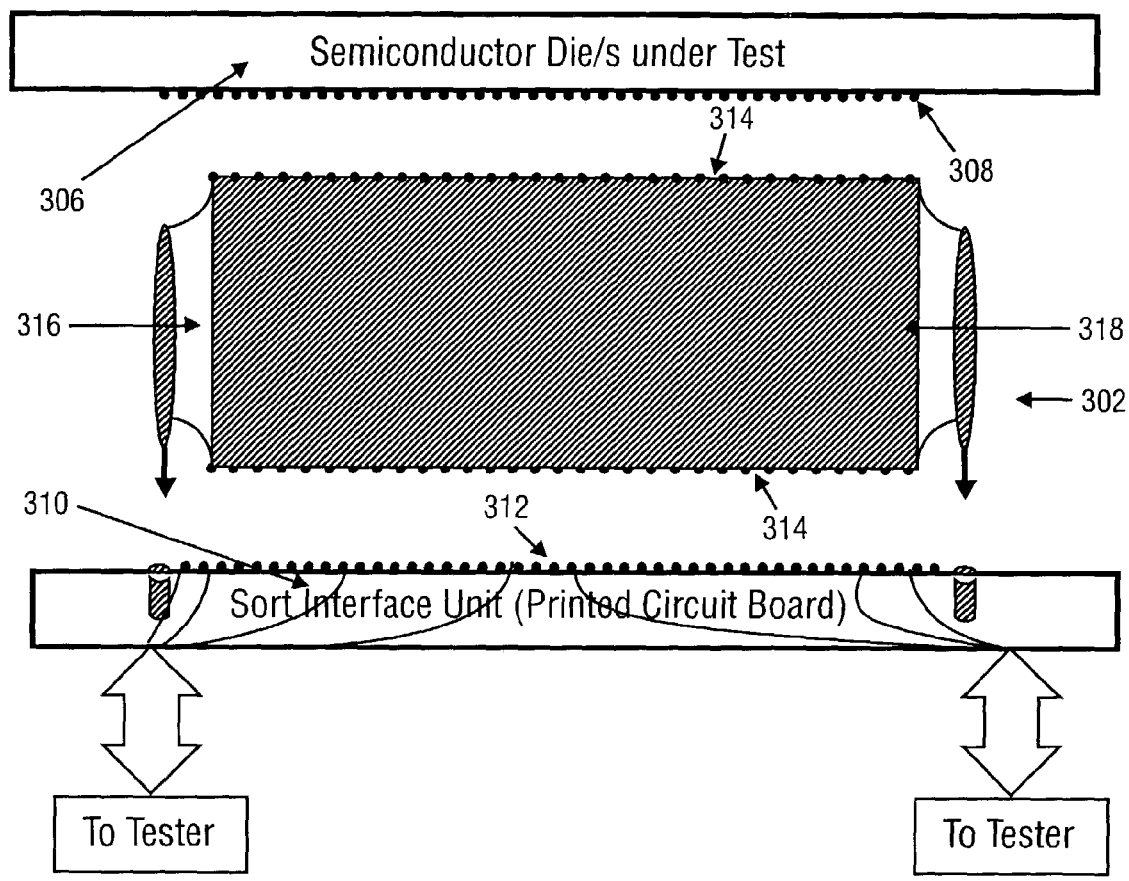
FIG. 3 illustrates a detailed cross section of an embodiment of a flexible probe head used to contact solder balls on semiconductor die under test.

FIG. 3 illustrates a detailed cross section of an embodiment 300 of flexible probe head 302 used to contact probe pads (bumps) 308 on semiconductor die under test 306 on one side, and the probe contact footprints 312 on the sort interface unit printed circuit board 310 on the other side. During testing, elastomer material 316 automatically assumes natural coplanarity of die 306 and of the sort interface unit printed circuit board 310.

Flexible probe head 302 includes fine electrical conductors 318 (wire studs or strands made of alloys of gold, copper and such like metals). Bunch of the conductors 318 (two or more strands) result in flexible probe tip arrays such as 314 on either side of the flexible probe head 302. Flexible probe tip arrays 314 establish electrical connections between bumps 308 and probe footprints 312. In particular, flexible elastomer material 316 is either impregnated with the electrical conductors 318 (wire studs or strands made of alloys of gold, copper and such like metals) or the elastomer material 316 houses the electrical conductors 318 in specially drilled holes. Density (i.e. the number of electrical conductors per unit area), and the electrical, mechanical and chemical properties of the electrical conductors 318 are implemented to typically ensure compatibility with the sort interface unit printed circuit board 310 and the semiconductor die under test 306. In a typical implementation, each conductive wire 318 is disposed with current day technologies anywhere from about 25 um to 100 um from each other.

In one embodiment, the flexible probe head 302 may be manufactured from commercially available elastic material such as anisotropic polymers, part number MT series manufactured from Shin-Etsu Polymer Co. Ltd. In another embodiment, probe head may be manufactured from flexible elastomer material, including but not limited to insulation rubber, soft silicon rubber, special polymers, etc. that can operate in wide temperature ranges (around −40 degree celsius to around +125 degree celsius to cover both cold and hot testing), capable of withstanding more than 10% compressions for at least 100,000 touch downs, and stable enough to remain inert to the cleaning chemistry.

Figure 4:
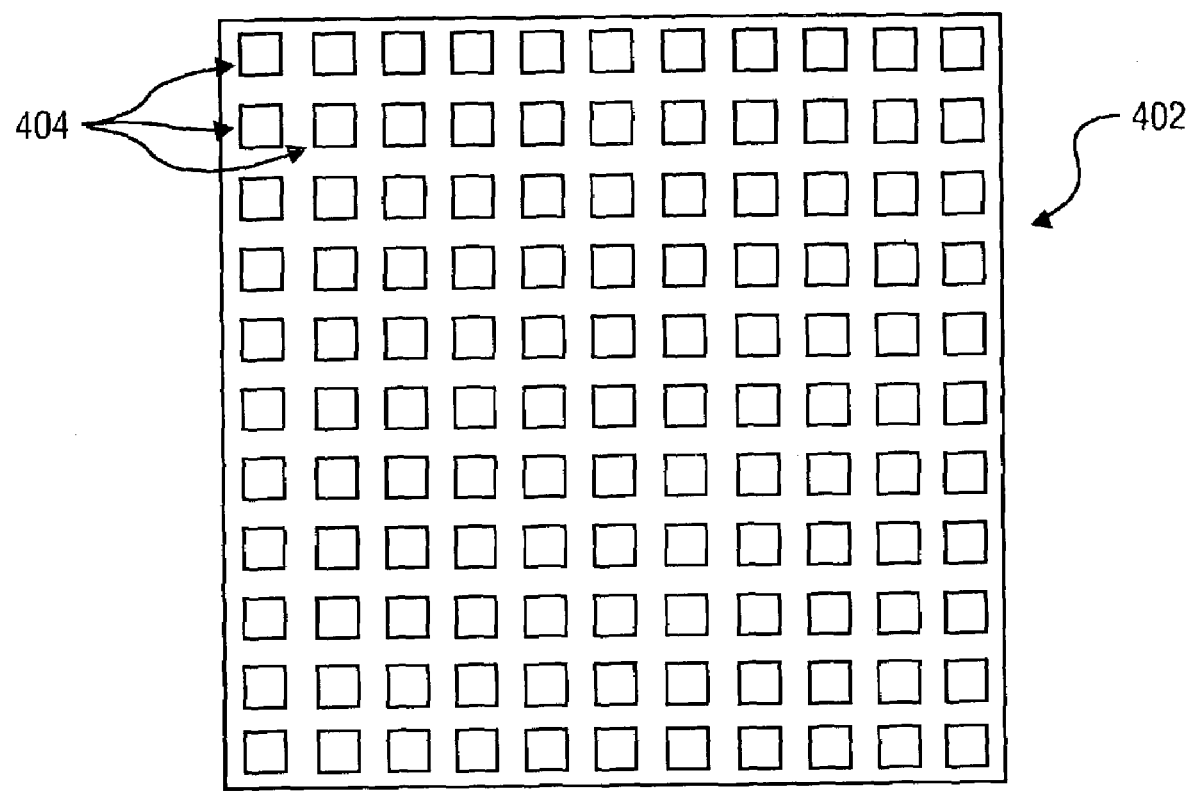
FIG. 4 illustrates a top view of an embodiment of a C4 bond pad configuration on semiconductor die under test.

For example, FIG. 4 illustrates a top side view of an embodiment 400 of a C4 bond pad configuration on semiconductor die 402. Bond pads 404 of semiconductor die 402 are formed along the top of the entire die 402 so that bond pads 404 now reside directly over the active circuitry region of die 402. By forming bond pads 404 in both the center and periphery of semiconductor die 402, more bond pads 404 can be placed across the surface of die 402 than can be placed only within the peripheral region. In addition, active circuitry which underlies bond pads 404 can be directly coupled to its nearest bond pad 404 using relatively short interconnect lines. This minimizes the resistive, capacitive, and inductive effects associated with routing interconnect lines over long distances, improving speed performance.

In a typical implementation, a semiconductor die 402 has a plurality of solder bumps disposed on its lower (as viewed) surface, such as in an array. Interface unit with C4 bumpout footprint has a corresponding plurality of contact structures disposed on its upper surface. The distal ends of these contact structures are arranged at the same pitch (spacing) as the solder bumps.

Flexible elastomer of probe head is machined into a shape that matches the bumpout and then inserted between interface unit and die under test 402. Probe head is compressed during testing, when probe head is disposed between semiconductor die under test and interface device. After testing is concluded and pressure released, probe head returns to its original shape. Flexible probe head includes conductive wires embedded in the flexible elastomer which reduces the force between probe head and semiconductor die under test when engaged. One skilled in the art will recognize that the flexible elastomer can be molded in a variety of probe head forms and is not limited to the C4 configuration shown in FIG. 4 and described in detail herein.

Figure 5:
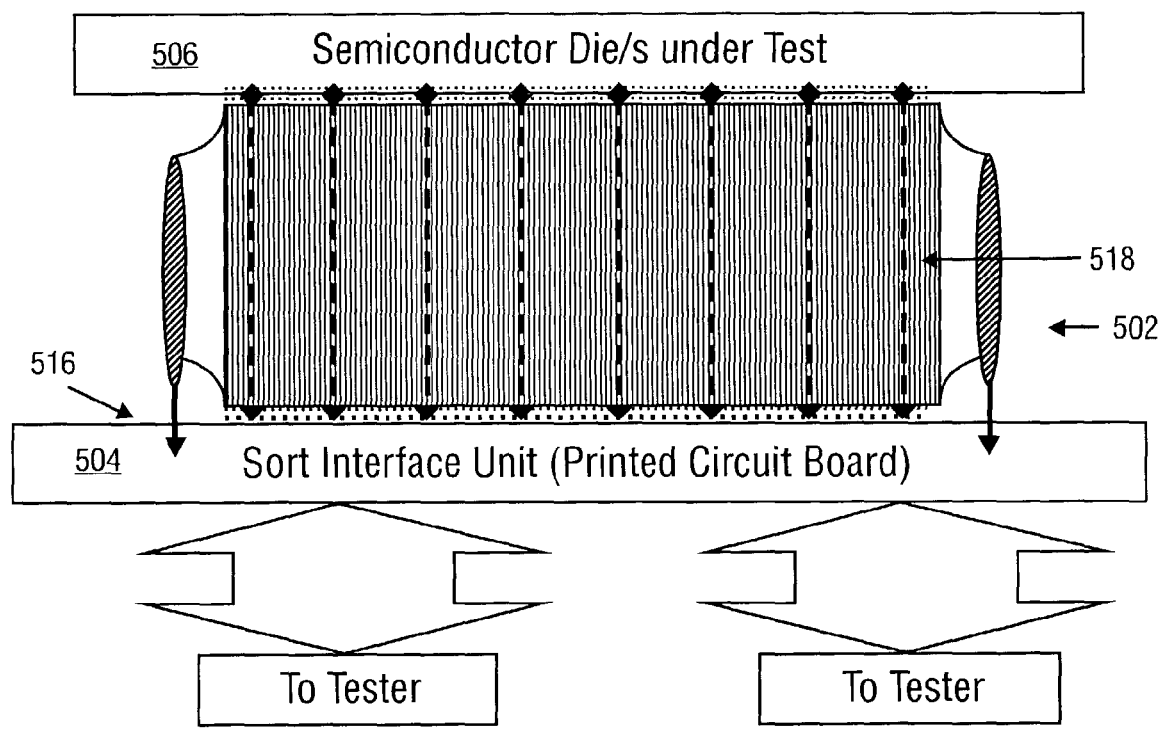
FIG. 5 illustrates a detailed cross section of an embodiment of a flexible probe head attached to fan out wiring on interface unit.

FIG. 5 illustrates a detailed cross section of an embodiment 500 of a flexible probe head 502 attached to fan out wiring (not shown) on first surface 516 of interface unit 504. Interface unit 504 includes a bump out that matches die under test 506. The contact structures on interface unit 504 are arranged at the same or substantially the same pitch as the bond pitch on the die under test 506.

In one embodiment, package and printed circuit board drawings are initially integrated together on a printed circuit board to form sort interface unit 504. In particular, once package drawing associated with die under test 506 is available, the package drawing is infused on multi-layer printed circuit board during the design stage. The package information to be infused onto interface unit 504 may be generated from a package drawing prepared in a conventional manner during the manufacture process by a packaging group. The purpose of the package is to take the signal from the wafer level microscopic bump out to a larger fan out. In particular, the package provides a interconnect pitch that is wider that the spacing of bond pads on die under test 506.

A contact pattern associated with the die under test 506 is then routed on interface unit 504. For example, a footprint of die under test 506 is formed on interface unit 504. In a typical implementation, a C4 bumpout footprint is routed and fabricated on interface unit 504. Probe head 502 contacts portions of the footprint of die under test 506. The footprint contains connections interfacing interface unit 504 with die under test 506. Electrical interconnections are then provided on interface unit 504 that routes signals from the test device to flexible probe head 502.

A plurality of gold bumps (not shown) is formed on a non-electrically conductive portion of interface unit 504 by conventional means known in the art. The bumps are located at the ends of circuit traces (not shown) extending to the periphery of the portion of interface unit 504. Gold bumps are formed through bump forming processes known in the art. The compositions of the gold bumps may include, but are not limited to pure gold. (Au) bond wire, as well as Be-or Cu-doped Au, or other Au-based alloys as known in the art. After die bumpout footprint is routed on interface unit 504, die under test 506 has a plurality of bond pads in the same configuration as the gold bumps on interface unit 504. Thus, when die under test 506 is placed on interface unit 504, bond pads and the gold bumps match. Other alignment methods known in the art may also be employed.

In operation, flexible probe head 502 contacts solder bumps on die under test 506 during a wafer sort. Flexible probe head 502 is thus directly sandwiched between die under test 506 and sort interface unit 504. Probe head 502 directly lands on interface unit 504. One or more dies are thus are in communication with printed circuit board, filling a "footprint" on interface unit 506. During wafer sort, flexible probe head 502 touches down on solder bumps which are part of die under test 506. After testing, flexible probe head 502 disengages die under test 506.

Figure 6:
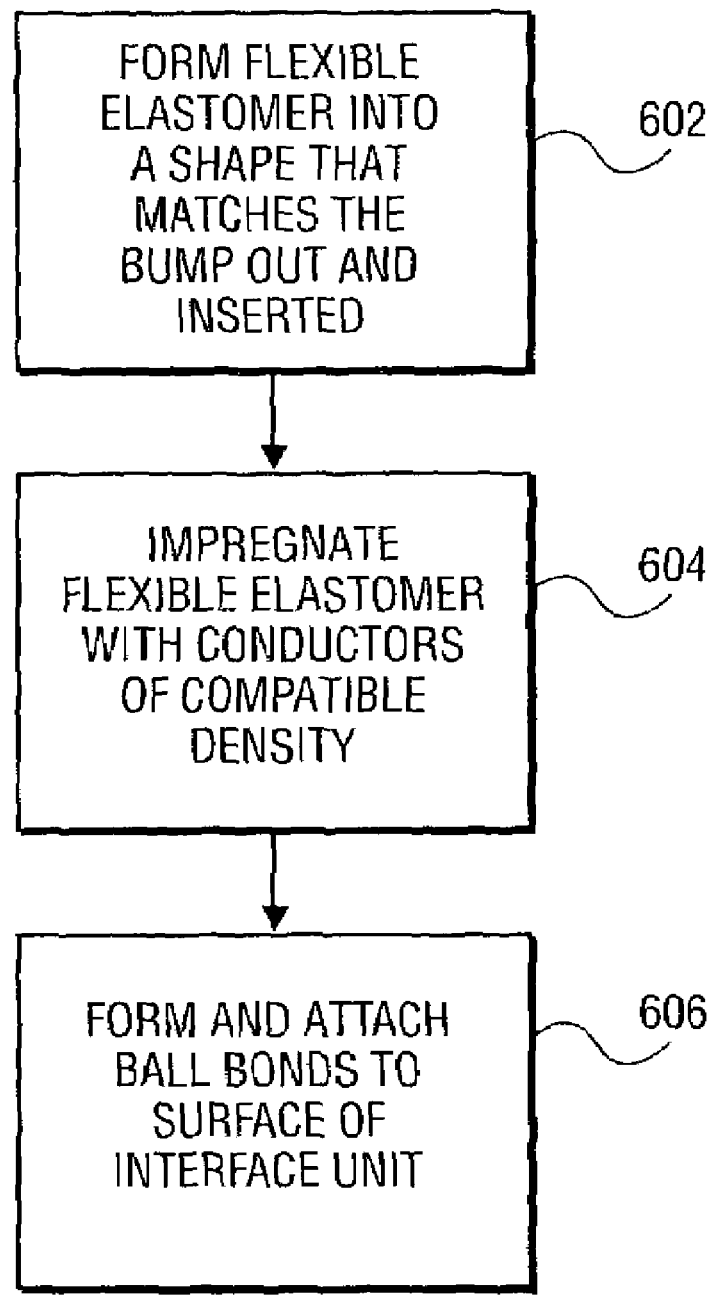
FIG. 6 illustrates a process flowchart of an embodiment for manufacturing flexible probe head.

FIG. 6 illustrates a process flowchart 600 for manufacturing flexible test probe according to one embodiment of the invention.

Flexible elastomer is formed into a shape that matches the bump out and then inserted between the interface unit and die under test (step 602).

Flexible elastomer is impregnated with electrical conductors, such as a plurality of conductive wires, each with a density compatible with interface unit and semiconductor die under test (step 604). In particular, each electrical conductor is machined precisely and then inserted into the flexible elastomer geometry and then socket i.e. probe head formed.

Ball bonds are then formed and attached to surface of interface unit (step 606). In particular, the ball shaped end of electrical conductor is attached to surface of interface unit. Bond wire is cut to leave a small stud protruding vertically from ball bond.

Figure 7:
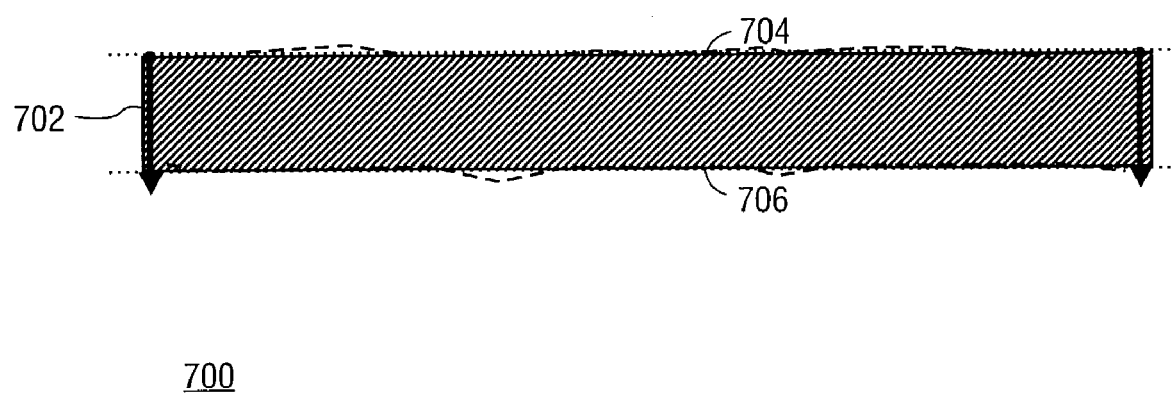
FIG. 7 illustrates a cross-section of an embodiment of a flexible probe head disposed between a wafer and printed circuit board.

FIG. 7 illustrates a cross-section of an embodiment 700 of an embodiment of flexible probe head 702 disposed between wafer 704 and printed circuit board 706. When pressed against wafer 704 on topside and printed circuit board 706 on bottom side, flexible probe head 702 automatically assumes the co-planarity on both sides.

Figure 8:
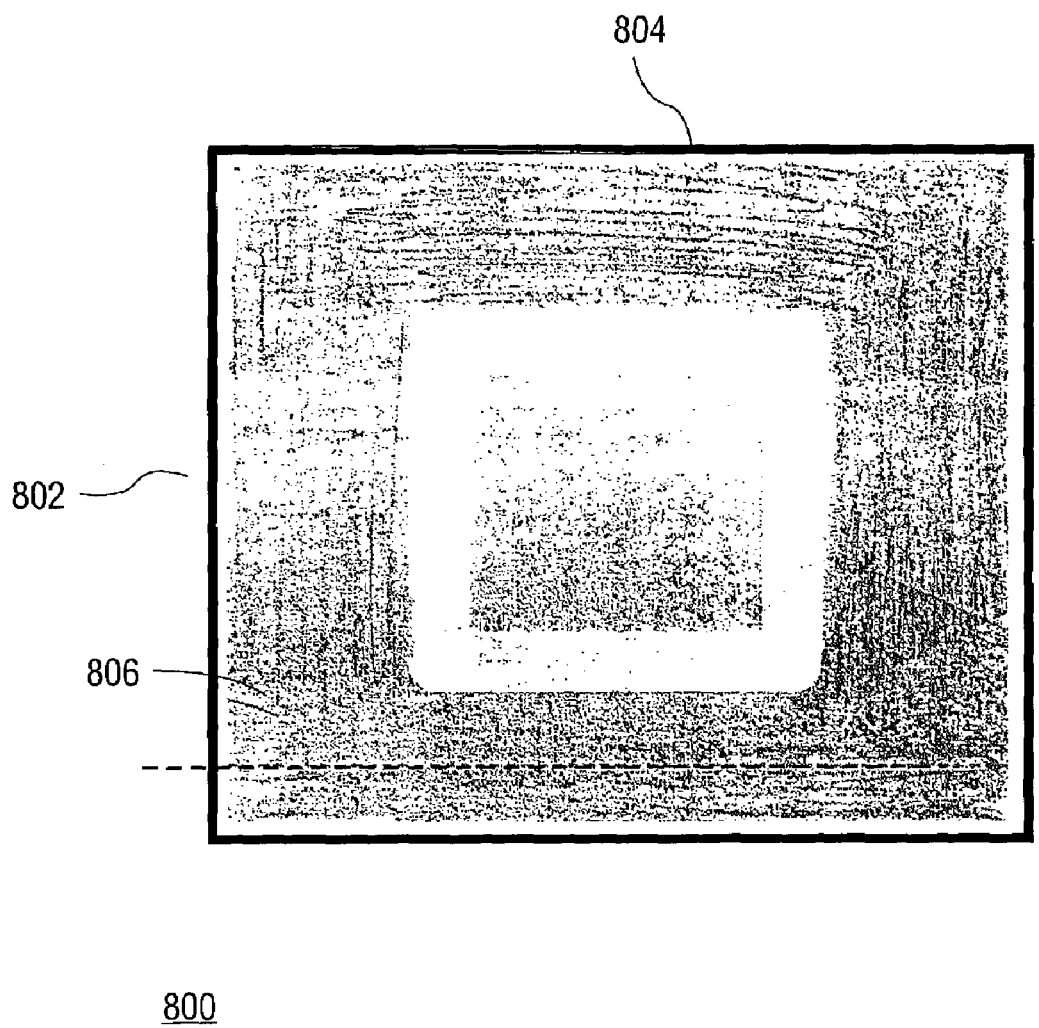
FIG. 8 illustrates a top view of an embodiment of a flexible probe head for a single die, vertical probing application.
Figure 9:
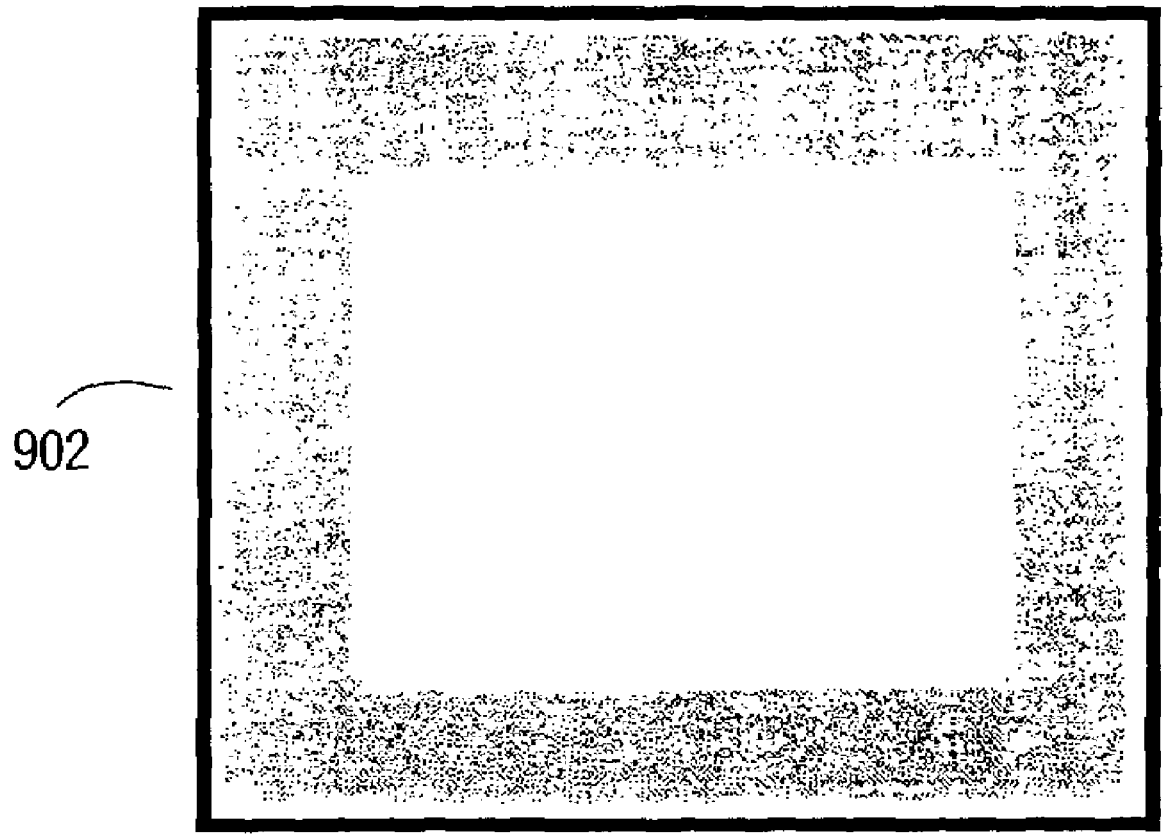
FIG. 9 illustrates a top view of an embodiment of a flexible probe head for a single die, horizontal probing application.
Figure 10:
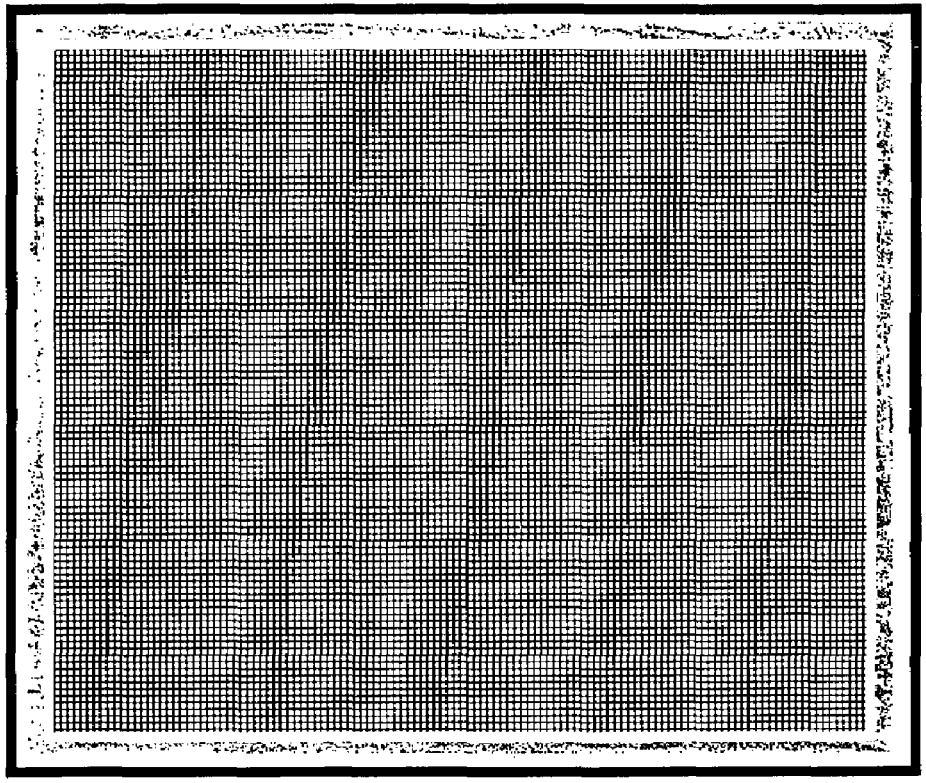
FIG. 10 illustrates a top view of an embodiment of flexible probe head for a multiple die probing application.

One skilled in the art will recognize that embodiments of the present invention may be implemented in a variety of ways. For example, FIG. 8 illustrates a top view of an embodiment 800 of flexible probe head 802 for a single die, vertical probing application. Flexible probe head 802 includes frame 804 and conductor strands embedded in the flexible insulator 806 (for example, silicon rubber). FIG. 9 illustrates a top view of an embodiment 900 of flexible probe head 902 for a horizontal probing application (for example, wire bond packaging). FIG. 10 illustrates a top view of an embodiment 1000 of flexible probe head 1002 for a multiple die probing application.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A probe device, comprising:
   a plurality of conductive wires; and
   a flexible material composition for receiving the plurality of conductive wires, wherein the flexible material facilitates natural co-planarity of a semiconductor device when subject to a compressive force, wherein a direct connection of signals is provided between a test device and the probe device without an interposer or space transformer between the test device and the probe device, such that a package drawing associated with the semiconductor device is infused on a printed circuit board of the probe device itself, a contact pattern associated with the semiconductor device is routed on the probe device, and direct electrical interconnections are provided between the test device to the probe device;
   wherein the flexible material composition is machined into a shape that matches a semiconductor device C4 pattern bond pad configuration and bond pads of the semiconductor device are formed along the top of the entire semiconductor device so that bond pads now reside directly over the active circuitry region of the semiconductor device.

2. The probe device claimed in claim 1, wherein the flexible material composition is comprised of anisotropic polymers.

3. An apparatus for testing a semiconductor device, comprising:
- a probe device including a plurality of conductive devices embedded in and extended through a material composition, the material composition comprising a high frequency elastomer that when subjected to a compressive force, facilitates natural co-planarity of the semiconductor device;
- a test device, wherein a direct connection of signals is provided between the test device and the probe device without an interposer or space transformer between the test device and the probe device, such that a package drawing associated with the semiconductor device is infused on a printed circuit board of the probe device itself, a contact pattern associated with the semiconductor device is routed on the probe device, and direct electrical interconnections are provided between the test device to the probe device;
- wherein the material composition is machined into a shape that matches a semiconductor device C4 pattern bond pad configuration and bond pads of the semiconductor device are formed along the top of the entire semiconductor device so that bond pads now reside directly over the active circuitry region of the semiconductor device.

4. The apparatus claimed in claim 3, wherein the material composition is comprised of anisotropic polymers.

5. A process comprising:
- forming a flexible elastomer composition into a shape that matches bump out of a semiconductor device;
- embedding a plurality of conductive devices into the flexible elastomer composition; and
- forming a direct connection of signals between a test device and a probe device without an interposer or space transformer between the test device and the probe device, infusing a package drawing associated with the semiconductor device on a printed circuit board of the probe device itself, routing a contact pattern associated with the semiconductor device on the probe device, and providing direct electrical interconnections between the test device to the probe device;
- wherein forming a flexible elastomer composition into a shape that matches semiconductor device bond pad configuration further comprises forming a flexible elastomer composition into a shape that matches a C4 bond pad configuration and forming bond pads of the semiconductor device along the top of the entire semiconductor device so that bond pads now reside directly over the active circuitry region of the semiconductor device.

6. The process claimed in claim 5, wherein embedding a plurality of conductive devices into the flexible elastomer composition further comprises:
- embedding a plurality of conductive wires with a density compatible with the probe device and semiconductor die under test.

7. The process claimed in claim 5, wherein forming a flexible elastomer composition into a shape that matches bump out of the semiconductor device comprises:
- forming a flexible elastomer that when subjected to a compressive force, facilitates natural co-planarity of the semiconductor device.

8. The process claimed in claim 5, wherein forming a flexible elastomer composition into a shape that matches bump out of the semiconductor device further comprises:
- forming a flexible elastomer composition comprised of anisotropic polymers.

9. The process claimed in claim 5, wherein the semiconductor device comprises one or more semiconductor dies.

10. The process claimed in claim 5 wherein the probe device comprises a probe head.

* * * * *